United States Patent [19]
Yang

[11] Patent Number: 6,011,750
[45] Date of Patent: Jan. 4, 2000

[54] SEMICONDUCTOR DEVICE HAVING ADDRESS TRANSITION DETECTING CIRCUIT

[75] Inventor: Dong Heon Yang, Chungcheongbuk-do, Rep. of Korea

[73] Assignee: LG Semicon Co., Ltd., Chungcheongbuk-Do, Rep. of Korea

[21] Appl. No.: 09/153,238

[22] Filed: Sep. 15, 1998

[30] Foreign Application Priority Data

Dec. 22, 1997 [KR] Rep. of Korea ............ 97-71795

[51] Int. Cl.[7] ............ H03K 19/00; G11C 7/00
[52] U.S. Cl. ............ 365/233.5; 365/230.06; 326/93
[58] Field of Search ............ 365/233.5, 230.06; 327/24, 293, 296, 297; 326/93

[56] References Cited

U.S. PATENT DOCUMENTS

| | | | |
|---|---|---|---|
| 5,313,120 | 5/1994 | Pelley, III | 307/480 |
| 5,343,082 | 8/1994 | Han et al. | 307/234 |
| 5,471,157 | 11/1995 | McClure | 365/233.5 |
| 5,493,538 | 2/1996 | Bergman | 365/233.5 |

*Primary Examiner*—Vu A. Le
*Attorney, Agent, or Firm*—Morgan, Lewis & Bockius LLP

[57] ABSTRACT

An address transition detecting circuit in a semiconductor device, the circuit includes a multiple address transition detecting part for detecting and outputting address signal transitions of a plurality of address signals, a single address transition detecting part for receiving a plurality of address transition signals, and detecting and outputting a single address signal transition, and address transition generating part for combining output signals of the multiple address transition detecting part and the single address transition detecting part.

9 Claims, 4 Drawing Sheets

SEMICONDUCTOR DEVICE HAVING ADDRESS TRANSITION DETECTING
CIRCUIT

This application claims the benefit of Korean Application No. 97-71795 filed Dec. 22, 1997, which is hereby incorporated by reference.

BACKGROUND OF THE INVENTION

1. Field of the Invention

The present invention relates to a semiconductor device and more particularly, a semiconductor device having an address transition detecting circuit. Although the present invention is suitable for a wide scope of applications, it is particularly suitable for securing a pulse width enough to allow a data transition when a single address signal is received.

2. Discussion of the Related Art

A background art ATD (Address Transition Detector) in a semiconductor memory device may malfunction due to unwanted ATD pulse generated by a noise from an internal circuit during operation, which causes a wrong detection of "high or low" value. Particularly, when a single ATD signal is applied, an accurate transmission of the address signal is difficult because an adequate pulse width can not be secured at the time of equalizing an I/O signal and transmission of an address transition signal. For example, as shown in FIG. 1A, when an I/O equalizing point is in general at a voltage of 2 V, the voltage applied and reached to the I/O equalizing point delivers "high" or "low" values to the next address in response to an address transition signal received. However, as shown in FIG. 1B, the applied voltage is higher than the 2 V of the I/O equalizing point, an exact reception and transmission of the next address transition signal is not possible. In addition, when a single ATD signal is received, an exact reading of the previous address signal at the I/O equalizing point is not possible due to a short pulse width. Thus, there has been a need to develop an address transition detecting circuit which can solve a drawback of the background art ATD circuit.

The background art ATD circuit will be explained with reference to the attached drawing. FIG. 2 illustrates a circuit diagram showing operation of the background art address detecting circuit having a multiple address transition detecting circuit adapted to receive a 2n number of address transition signals $AT_1 \sim AT_{2n}$. Specifically, an n number of NOR gates NOR1, NOR2, NOR3~NORn each receives two of the address transition signals $AT_1 \sim AT_{2n}$ in an order and is subject to a logical summation and inversion. A NAND gate receives signals from the n number of NOR gates and is subject to a logical production and inversion to provide a final address transition signal.

The operation of the aforementioned background art ATD circuit will be explained with reference to FIG. 3 illustrating waveforms for showing operation of the background art ATD circuit.

Referring to FIG. 3 when multiple high address signals are received from the first high address signal to the last high address signal in succession, a high signal can be provided through the ATD terminal. That is, when a high signal is received, the address transition detecting circuit can provide the high signal. When a multiple address transition signal is required, a pulse width wide enough to detect an address transition signal at the data I/O equalizing point can be secured. On the contrary, when a single address transition signal is received, a pulse width wide enough to transmit an address transition signal at the I/O equalizing point can not be secured because a pulse width only as much as the received single address transition signal can be secured.

As a result, the background art ATD circuit has the following problems.

An enough pulse width can not be secured at an I/O equalizing point when a single address transition signal is received: Particularly, when a high source voltage is received, an address signal is not accurately transmitted because no proper data I/O equalization can be achieved in the background art ATD circuit.

SUMMARY OF THE INVENTION

Accordingly, the present invention is directed to an address transition detecting circuit that substantially obviates one or more of the problems due to limitations and disadvantages of the related art.

An object of the present invention is to provide a semiconductor device having an address transition detecting circuit which secures enough of a pulse width at an I/O equalizing point even when a single address transition signal is received.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a semiconductor device having an address transition detecting circuit includes a multiple address transition detecting part for detecting and providing address signal transitions of a plurality of address signals, a single address transition detecting part for receiving a plurality of address transition signals and detecting and providing a single address signal transition, and an address transition generating part for combining output signals of the multiple address transition detecting part and the single address transition detecting part.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENTS

Reference will now be made in detail to the preferred embodiments of the present invention, examples of which are illustrated in the accompanying drawings.

Figure 1A:
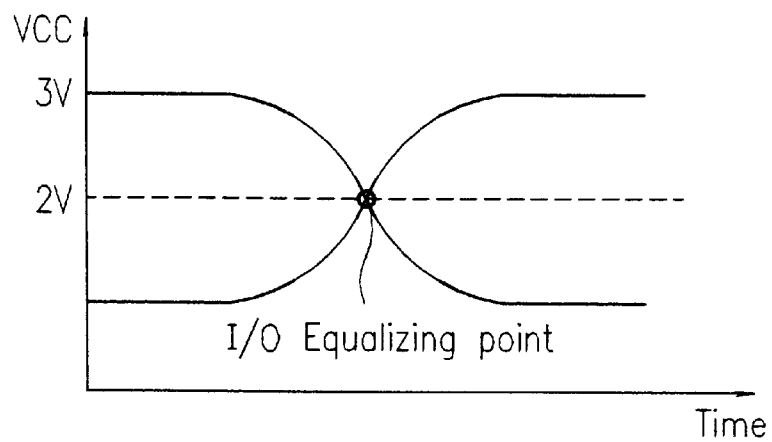
FIG. 1A is a graph showing an I/O equalizing point of a background art address transition detecting circuit.
Figure 1B:
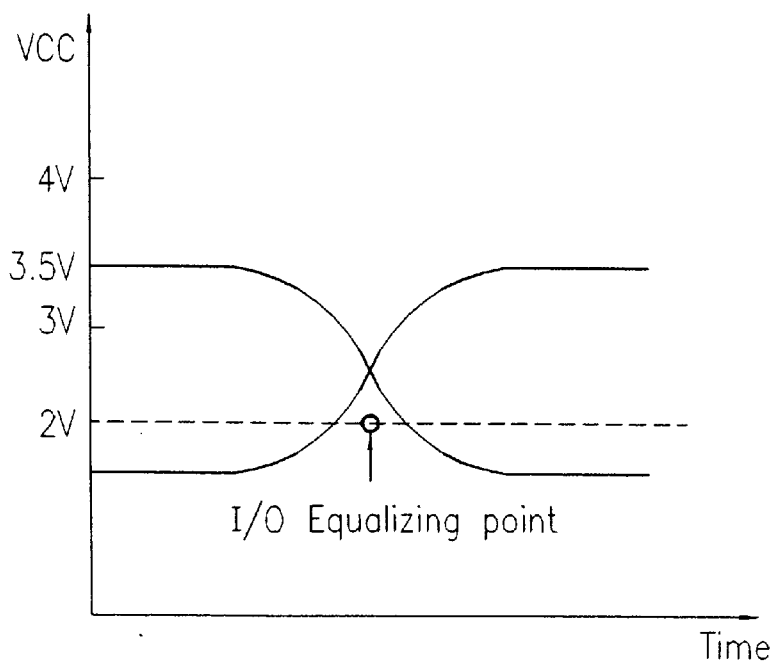
FIG. 1B is a graph showing an I/O equalizing point of an address detecting circuit with a high source voltage.
Figure 2:
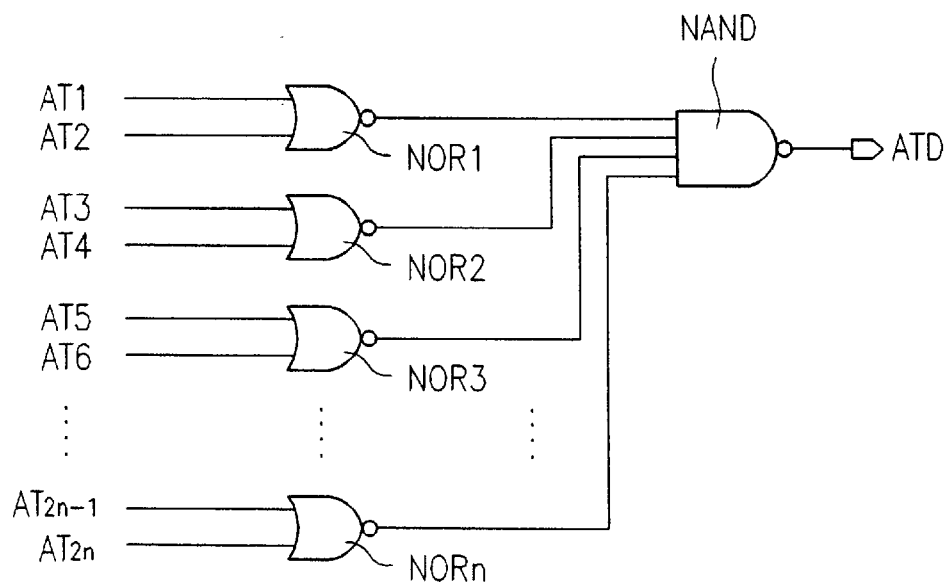
FIG. 2 is a circuit diagram showing a background art address transition detecting circuit.
Figure 3:
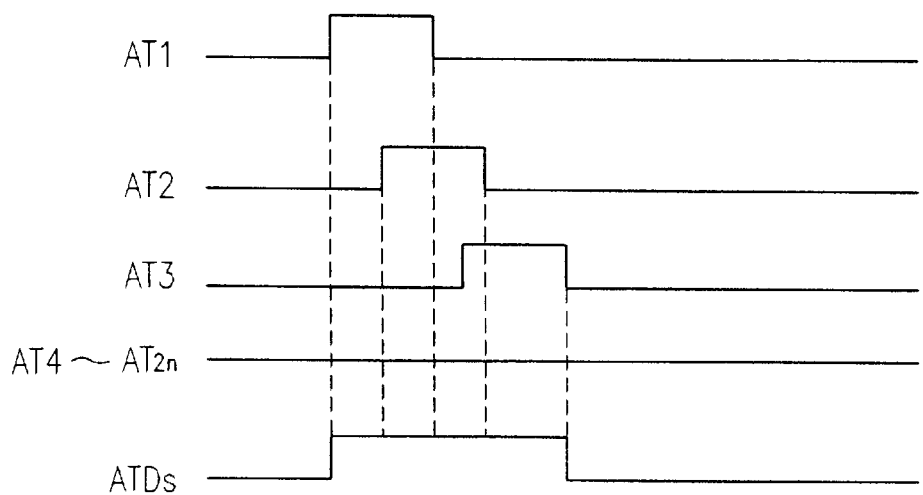
FIG. 3 is waveforms for showing operation of a background art address transition detecting circuit.
Figure 4:
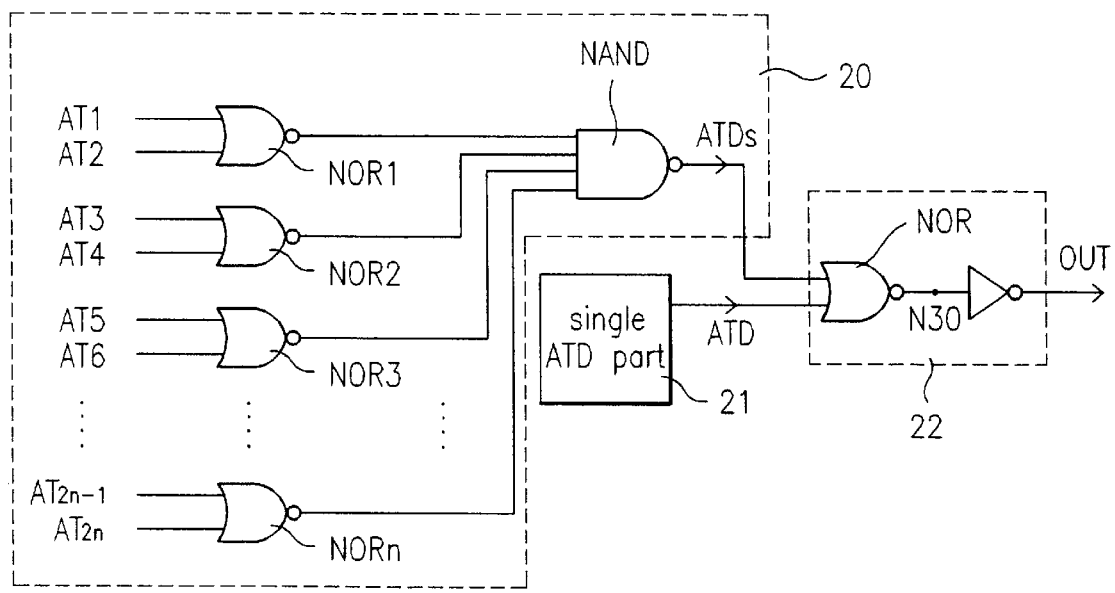
FIG. 4 is a circuitry block diagram showing an address transition detecting circuit in accordance with a preferred embodiment of the present invention.

Referring to FIG. 4, an address transition circuit in accordance with an embodiment of the present invention includes a multiple address transition detecting part 20 for receiving a plurality of address transition signals $AT_1$, $AT_2$, ~, $AT_{2n-1}$, $AT_{2n}$ and providing a multiple address transition detecting signal ATDs, a single address transition detecting part 21 for receiving a single signal from the plurality of address signal receiving terminals $AT_1$, $AT_2$, ~, $AT_{2n-1}$, $AT_{2n}$ and providing a single address transition detecting (ATD) signal, and an address transition generating part 22. Specifically, the multiple address transition detecting part 20 includes n NOR gates at each for receiving two signals from the address signal receiving terminals $AT_1$, $AT_2$, ~, $AT_{2n-1}$, $AT_{2n}$ in this order, subjecting to a logical summation and address transition detecting ATD signals.

Figure 5:
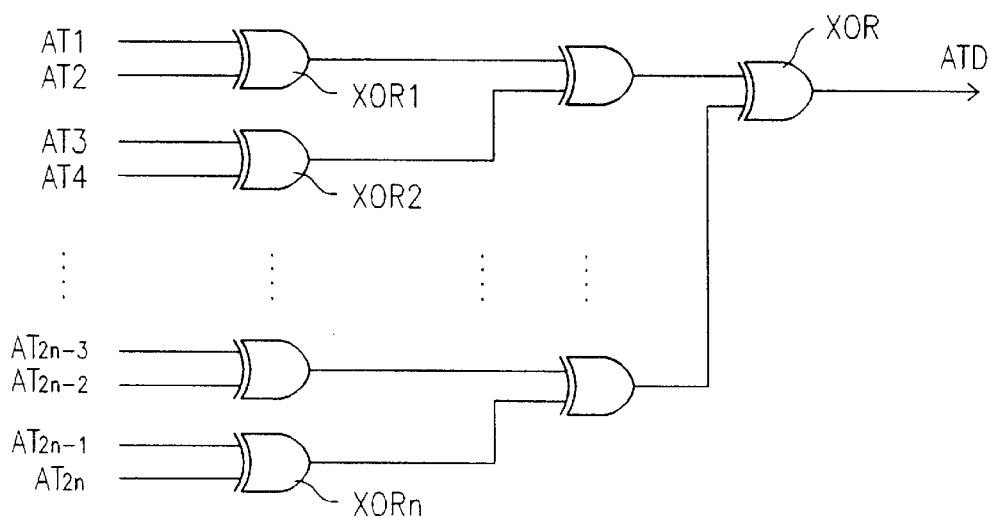
FIG. 5 is a circuit diagram showing a single address transition detecting part of FIG. 4 in accordance with a preferred embodiment of the present invention.

Referring to FIG. 5, the single address transition detecting part 21 includes n first exclusive OR gates each for receiving two signals from the address signal receiving terminals $AT_1$, $AT_2$, ~, $AT_{2n-1}$, $AT_{2n}$, in this order and subjecting to an exclusive OR operation n/2 second exclusive OR gates each for receiving two signals from the n first exclusive OR gates in this order and subjecting to an exclusive OR operation, a plurality of third exclusive OR gates for reception and subjecting to an exclusive OR operation of signals from the n/2 second exclusive OR gates by two in this order to provide two signals at the end, and a fourth exclusive OR gate for subjecting to exclusive OR operation for two signals from the third exclusive OR gate to provide one address transition detecting signal ATD. The address transition generating part 22 includes an NOR gate NOR for receiving signals from the multiple address transition detecting part 20 and the single address transition detecting part 21 and subjecting to a logical summation and inversion, and ani inverter INV for inverting a signal from the NOR gate NOR through a node N30 to provide a final address transition signal having an appropriate pulse width.

Figure 6A:
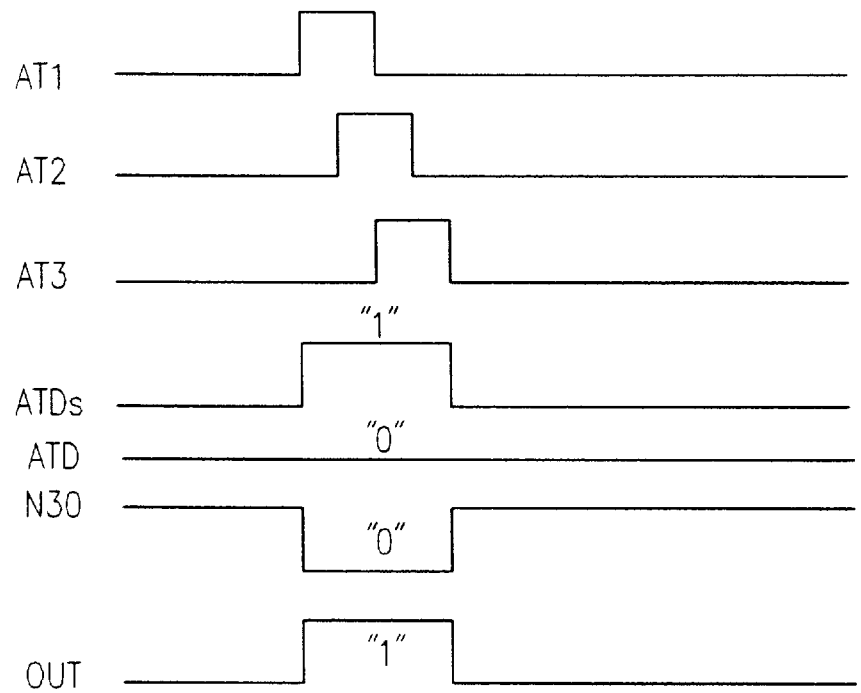
FIG. 6A is waveforms for showing operation of a multiple address transition detecting part of FIG. 4 in accordance with a preferred embodiment of the present invention.
Figure 6B:
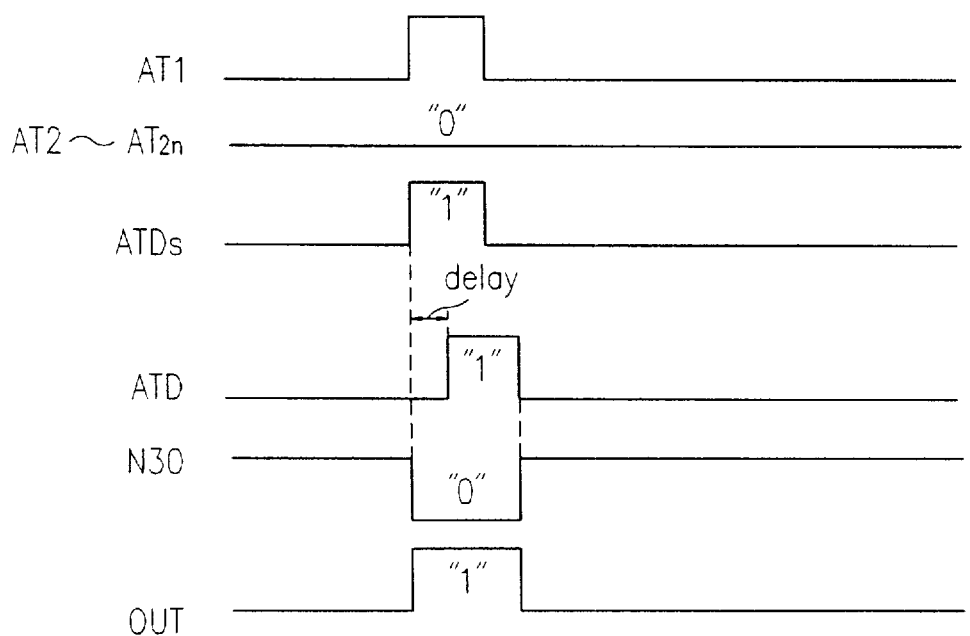
FIG. 6B illustrates waveforms showing operation of a single address transition detecting part in accordance with a preferred embodiment of the present invention.

The operation of the address transition detecting circuit of the present invention will be explained with reference to the attached drawings. FIG. 6A and 6B are waveforms for showing operation of a multiple address transition detecting part 20 and a single address transition detecting part 21 in accordance with a preferred embodiment of the present invention, respectively. The address transition detecting circuit of the present invention is provided to eliminate a problem caused by a single address signal. In other words, the address transition detecting circuit of the present invention utilizes conditions when the single address transition detecting part 21 provides a high signal with reception of a single address signal and a low signal with reception of multiple address signals.

The operation of the address transition detecting circuit of the present invention including the aforementioned single address transition detecting part 21 will be explained in two parts.

First, referring to FIGS. 4, 5, and 6A, upon receiving multiple address transition signals, a low signal is provided on the ATD terminal through the exclusive OR gates in the single address transition detecting part 21, and a high signal is provided through the NAND gate NAND in the multiple address transition detecting part 20. A low signal is provided at a node 30 N30 through the NOR gate which receives an output of the exclusive OR gate XOR and a signal ATDs from the multiple address transition detecting part 20 through the NAND gate. A high signal is then provided at the Out terminal OUT of the address transition generating part 22 through the inverter INV. Thus, when multiple address transition signals are received, the signal from the multiple address transition detecting part 20 is outputted without variation. This is so that the address transition detecting circuit can secure an appropriate pulse width at the data I/O equalizing point.

Second, referring to FIGS. 4, 5, and 6B, upon receiving a single address transition signal, the single address transition detecting part 21 operates and combines the output signal ATDs of the multiple address transition detecting part 20 and the output signal ATD from the single address transition detecting part 21. When a single address transition signal is received, a high signal is received only at the first address transition signal $AT_1$ terminal. The multiple address transition detecting part 20 thus provides a signal identical to the signal at the $AT_1$ without any delay of signal at the output terminal ATDs. Conversely, the single address transition detecting part 21 provides the received first transition signal ATI with a delay at the output terminal ATD. The signal from the single address transition detecting part 21 is delayed because the signal passes through far more exclusive OR gate stages in case of the single address transition detecting part 21 than that of the multiple address transition detecting part 20. For example, if there are 8 address transition signal terminals, the multiple address transition detecting part 20 can provide an output through a two stage logical combination while the single address transition detecting part 21 can provide an output only after passing through a four stage logical combination. The NOR gate NOR adapted to receive outputs of the two output terminals ATD and ATDs provides a signal to the node 30 N30. The node 30 N30 then outputs a low signal until either of the outputs through the multiple address transition detecting part 20 and the single address transition detecting part 21 is at high. A high signal is provided through the inverter INV. Thus, when a single address transition signal is received, the output signal ATD of the single address transition detecting part 21 is delayed then the input signal to the multiple address transition detecting part 20, so that the address transition detecting circuit has an appropriate pulse width.

The address transition detecting ATD circuit of the present invention has the following advantages.

An appropriate pulse width at an equalizing point of a data I/O line by devising the address transition detecting circuit to have an appropriate pulse width in receiving a single address transition signal, allows a stable detection of an address transition signal even under a high source voltage Vcc.

It will be apparent to those skilled in the art that various modifications and variations can be made in the address transition detecting circuit of the present invention without departing from the spirit or scope of the invention. Thus, it is intended that the present invention cover the modifications and variations of this invention provided they come within the scope of the appended claims and their equivalents.

What is claimed is:

1. An address transition detecting circuit in a semiconductor device, the circuit comprising:

a multiple address transition detecting part for detecting an outputting address signal transitions of a plurality of address signals;

a single address transition detecting part for receiving a plurality of address transition signals, and detecting and outputting a single address signal transition; and an address transition generating part for combining output signals of the multiple address transition detecting part and the single address transition detecting part.

2. The circuit according to claim 1, wherein the multiple address transition detecting part comprises:

a plurality of NOR gates each for receiving two of the address signals in an order, and subjecting to logical summation and inversion; and an NAND gate for a logical production and inversion for signals from the NOR gates to provide address transition detecting signals.

3. The circuit according to claim 1, wherein the single address transition detecting part comprises:

a plurality of first exclusive OR gates each for receiving two neighboring address signals, and subjecting to an exclusive OR operation;

a plurality of second exclusive OR gates each for receiving two neighboring signals from the first exclusive OR gates and subjecting to an exclusive OR operation;

a plurality of third exclusive OR gates for receiving and subjecting to an exclusive OR operation of signals from the second exclusive OR gates by two neighboring output signals; and a fourth exclusive OR gate for an exclusive OR operation for the signals from the third exclusive OR gates.

4. The circuit according to claim 1, wherein the address transition generating part comprises:

an NOR gate for receiving signals from the multiple address transition detecting part and the single address transition detecting part and subjecting to a logical summation and inversion to output a signal; and an inverter for inverting the signal from the NOR gate.

5. The circuit according to claim 1, wherein the multiple address transition detecting part includes 2n addresses.

6. The circuit according to claim 2, wherein the multiple address transition detecting part includes n NOR gates.

7. The circuit according to claim 3, wherein the single address transition detecting part includes n first exclusive OR gates.

8. The circuit according to claim 3, wherein the single address transition detecting part includes n/2 second exclusive OR gates.

9. The circuit according to claim 3, wherein the single address transition detecting part includes n/4 third exclusive OR gates.

* * * * *